(12) United States Patent
Martinelli

(10) Patent No.: US 8,363,374 B2
(45) Date of Patent: *Jan. 29, 2013

(54) SYNCHRONOUS RECTIFIED SWITCH WITH AUTO FAULT CLEARING

(75) Inventor: Robert Matthew Martinelli, Murrieta, CA (US)

(73) Assignee: The Boeing Company, Chicago, IL (US)

( * ) Notice: Subject to any disclaimer, the term of this patent is extended or adjusted under 35 U.S.C. 154(b) by 24 days.

This patent is subject to a terminal disclaimer.

(21) Appl. No.: 12/965,920

(22) Filed: Dec. 12, 2010

(65) Prior Publication Data

US 2012/0147510 A1  Jun. 14, 2012

(51) Int. Cl.
*H02H 5/04* (2006.01)

(52) U.S. Cl. .................................................. 361/104

(58) Field of Classification Search .................. None
See application file for complete search history.

(56) References Cited

U.S. PATENT DOCUMENTS

| | | | | |
|---|---|---|---|---|
| 5,285,208 A * | 2/1994 | Bertiger et al. | ............... | 342/352 |
| 5,754,384 A * | 5/1998 | Ashley | ........... | 361/93.9 |
| 6,268,713 B1 * | 7/2001 | Thandiwe | ..................... | 320/134 |
| 6,275,366 B1 * | 8/2001 | Gelbien et al. | ................... | 361/62 |
| 6,710,995 B2 * | 3/2004 | Knoedgen | ..................... | 361/104 |
| 7,777,367 B2 | 8/2010 | Choy et al. | | |

* cited by examiner

*Primary Examiner* — Stephen W Jackson
*Assistant Examiner* — Angela Brooks
(74) *Attorney, Agent, or Firm* — Ameh IP; Elahe Toosi; Lowell Campbell

(57) ABSTRACT

A fault tolerant synchronous rectifier regulator system and method are disclosed. In the system and method, a high side switch is operable to be coupled to an electrical bus, and a low side switch is coupled to a common ground. In addition, a first fuse is coupled to the high side switch and the low side switch, and operable to open in response to a first fault. Furthermore, a second fuse is coupled to the high side switch and the first fuse, and operable to be coupled to a current source and to open in response to a second fault.

22 Claims, 3 Drawing Sheets

SYNCHRONOUS RECTIFIED SWITCH WITH AUTO FAULT CLEARING

FIELD

Embodiments of the present disclosure generally relate to voltage and current regulating systems. More particularly, embodiments of the present disclosure relate to voltage and current regulating systems that may have application for electrical power sources and loads, which may comprise spacecraft solar panels or other types of power sources coupled in a series, parallel, and other type of arrangement.

BACKGROUND

Many types of electrical power sources such as solar arrays may comprise single or multiple elements coupled in series, parallel, or other appropriate configuration. The power sources may be coupled to a load, such as but without limitation, an electrical bus, a battery, and the like. The power sources may also be coupled to power regulators whereby current can be directed to the load or diverted away from the load by, for example but without limitation, shorting out circuits and returning current back to the power sources. In some electrical systems such as a closed electrical system, for example but without limitation, a spacecraft, a ship, and the like, controlling current in this manner may be required to maintain voltage regulation of an electrical bus.

For example but without limitation, in a closed electrical system comprising a regulated electrical bus, current may be provided to satisfy an electrical demand of a load, and excess current from the power sources may not be needed. Control circuits may be used to divert current away from a subset of power sources of a group of power sources to match power output meet a load demand. Voltage regulation and control circuits used to regulate electrical buses and power sources may fail in a shorted mode.

SUMMARY

A fault tolerant synchronous rectifier regulator system and method are disclosed. In the system and method, a high side switch is operable to be coupled to an electrical bus, and a low side switch is coupled to a common ground. In addition, a first fuse is coupled to the high side switch and the low side switch, and is operable to open in response to a first fault. Furthermore, a second fuse is coupled to the high side switch and the first fuse, and is operable to be coupled to a current source and to open in response to a second fault. By using the high side switch as well as a combination of the first and second fuses, embodiments of the disclosure automatically clear faults using an automatic fault tolerant system at a significantly reduced power dissipation which in turn reduces a weight of the fault tolerant system thereby reducing a weight of a structure, such as a spacecraft that contains the fault tolerant system. This reduction in weight also translates into space and cost savings, which are useful for many types of power sources and load interaction devices.

In an embodiment, a fault tolerant synchronous rectifier regulator system comprises a high side switch operable to be coupled to an electrical bus, and a low side switch coupled to a common ground. The system further comprises a first fuse coupled to the high side switch and the low side switch and operable to open in response to a first fault. The system further comprises a second fuse coupled to the high side switch and the low side switch, and operable to be coupled to a current source and to open in response to a second fault.

In another embodiment, an automatic fault tolerant synchronous rectified regulation method synchronously rectifies a current from a current source into a current for an electrical bus using a high side switch, and a low side switch coupled to a common ground. The method further provides a first fuse coupled to the high side switch and the low side switch, and provides a second fuse coupled to the high side switch and the low side switch.

Yet another embodiment comprises a method for fault tolerant synchronous rectification of a regulator system. The method synchronously rectifies a current from a current source into a current for an electrical bus using a high side switch to be coupled to the electrical bus, a bypass rectifier coupled to the current source and the high side switch, and a low side switch coupled to a common ground. The method further opens a first fuse coupled to the high side switch and the low side switch, if a fault occurs in the high side switch, and opens the first fuse, if a fault occurs in the low side switch. The method also opens a second fuse coupled to the high side switch and the low side switch, if a fault occurs in the current source, and opens the second fuse, if a fault occurs in the bypass rectifier.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

DETAILED DESCRIPTION

Figure 1:
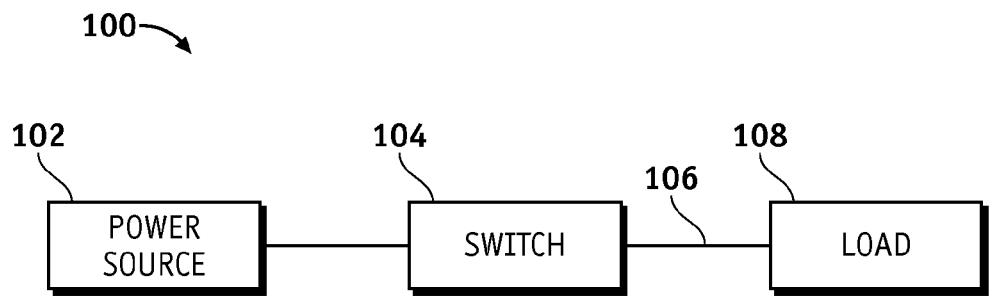
FIG. 1 is an illustration of an exemplary schematic functional block diagram of a fault tolerant synchronous rectifier regulator system according to an embodiment of the disclosure.

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding field, background, summary or the following detailed description. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to circuit design, and other functional aspects of the systems (and the individual operating components of the systems) may not be described in detail herein. In addition, those skilled in the art will appreciate that embodiments of the present disclosure may be practiced in conjunction with a variety of hardware and software, and that the embodiments described herein are merely example embodiments of the disclosure.

Embodiments of the disclosure are described herein in the context of a practical non-limiting application, namely, voltage conversion on a spacecraft or a satellite. Embodiments of the disclosure, however, are not limited to such spacecraft or satellite applications, and the techniques described herein may also be utilized in other applications. For example but without limitation, embodiments may be applicable to, aircraft, ships, automobiles, buildings, trains, a super-heated thermal couple from a reactor, various voltage conversion applications and circuits, and the like.

The embodiments apply to substantially all types of series/parallel electrical power generation sources (power sources), as well as substantially all types of vehicles that have power sources and loads that may communicate energy as explained in more detail below in the context of discussion of FIGS. 1-2.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

In various applications, a power source (e.g., a spacecraft solar panel or other power source) is coupled to another device (e.g., an electrical bus or another load) through a voltage regulator. Embodiments of the disclosure comprise a fault tolerant synchronous rectifier regulator system comprising a synchronous rectifier as well as a combination of fuses that result in a fault tolerant system. In the fault tolerant system, if a component shorts, one or more of the fuses opens and the power source remains coupled to the another device. The fault tolerant synchronous rectifier regulator system is operable to function as a synchronous rectifier boost converter.

FIG. 1 is an illustration of an exemplary schematic functional block diagram of a fault tolerant synchronous rectifier regulator system 100 (fault tolerant system 100) according to an embodiment of the disclosure. The fault tolerant system 100 may comprise a synchronous rectified switch 104 (switch 104) coupled to a power source 102 and to a load 108 via an electrical bus 106.

As mentioned above, the fault tolerant system 100 applies to substantially all types of series/parallel electrical power generation sources (power sources). The fault tolerant system 100 also applies to substantially all types of vehicles that have power sources such as the power source 102 and loads such as the load 108 that may communicate energy. The vehicles may comprise, for example but without limitation, a spacecraft, a satellite, an automobile, and the like.

The power source 102 may comprise, for example but without limitation, a solar panel, a generator, a battery, satellite power sources, spacecraft power sources, aircraft power sources, shipboard generators, train power sources, solar and engine powered long-duration aircraft and spacecraft (manned and unmanned) power sources, a super-heated thermal couple from a reactor, and the like. Additionally, the fault tolerant system 100 may comprise power sources applied to, for example but without limitation, solar, wind, and marine wave energy generation farms/power sources, generator arrays, and the like.

The synchronous rectified switch 104 comprises a synchronous rectifier as well as a combination of fuses that result in a fault tolerant system as explained in more detail in the context of discussion of FIG. 2 below. In the fault tolerant system 100, if a component shorts, one or more of the fuses opens and the power source 102 remains coupled to the electrical bus 106 or to the load 108 via the electrical bus 106.

The load 108 may comprise, for example but without limitation, an electronic device, a motor, a heater, a power distribution system, an appliance, an additional electrical bus, and the like. The load 108 may be coupled to the switch 104 via the electrical bus 106, such as but without limitation, a spacecraft power bus, a satellite power bus, a ship electrical bus, an automobile electrical bus, a power grid electrical bus, a battery bus, and the like. The fault tolerant system 100 may be used in, for example but without limitation, a spacecraft, a satellite, an automobile, and the like.

Figure 2:
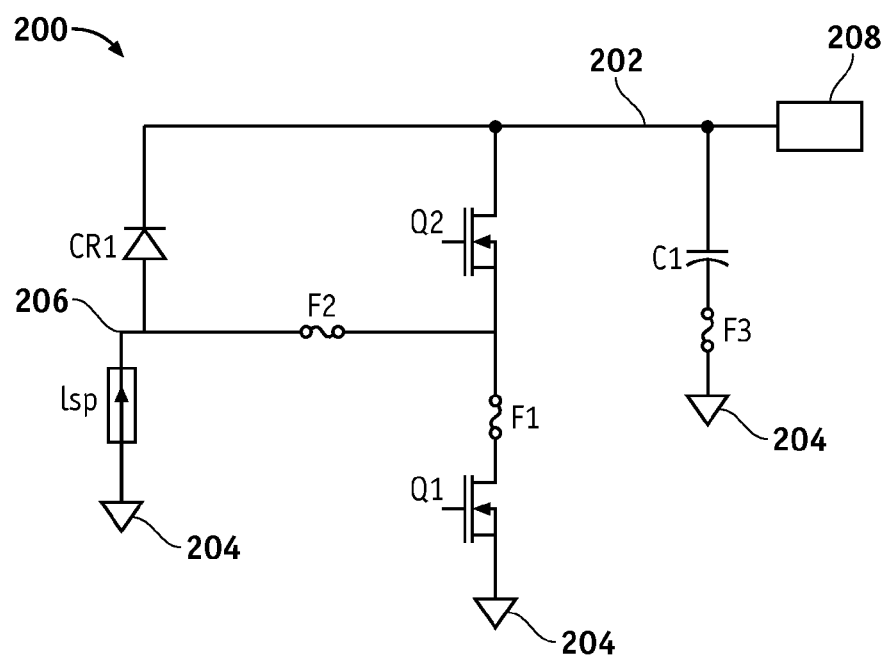
FIG. 2 is an illustration of an exemplary fault tolerant synchronous rectifier regulator system according to an embodiment of the disclosure.

FIG. 2 is an illustration of an exemplary fault tolerant synchronous rectified regulator system 200 (system 200) showing details of the fault tolerant system 100 according to an embodiment of the disclosure. The system 200 may comprise, a high side switch Q2, a low side switch Q1, an output capacitor C1, a bypass rectifier CR1, a fuse F1, a fuse F2, a fuse F3, a current source Isp (power source 102 in FIG. 1), an electrical bus 202 (106 in FIG. 1), and a common ground 204. The system 200 is operable to function as a synchronous rectified switch. By using the high side switch Q2 as well as a combination of the fuses F1-F3, the system 200 provides a fault tolerant system that can significantly reduce power dissipation. The significantly reduced power dissipation in turn reduces a weight of the system 200. Reducing the weight of the system 200 can reduce a weight of a spacecraft as explained in more detail below. Furthermore, reducing the weight also translates into space and cost savings, which are useful for many types of power sources and load interaction devices.

While the embodiment shown in FIG. 2 utilizes an n-type FET as an example for the high side switch Q2 and the low side switch Q1, the high side switch Q2 and the low side switch Q1 may comprise any switching component. For example but without limitation, the high side switch Q2 and the low side switch Q1 may comprise the n-type FET, a p-type FET, a switch, a force commutated rectifier, a rectifier switch, and the like.

The fuses F1, F2, and F3 are coupled in series to the low side switch Q1, the current source Isp, and the output capacitor C1 respectively. As a result, if any component of the system 200 shorts or fails, one or more of the fuses F1-F3 opens and the current source Isp is left connected to the electrical bus 202 (e.g., a 100 Volt electrical bus) through the bypass rectifier CR1. In this manner, the system 200 provides a fault tolerant system. A fault may comprise, for example but without limitation, a short, an overload current, a stuck-closed fault, and the like. In this document, short and fault may be used interchangeably.

The fuse F1 is coupled in series to the low side switch Q1, and is operable to open if a short occurs in the high side switch Q2. In this manner, the current source Isp can remain connected (or coupled) to the electrical bus 202 through both the bypass rectifier CR1 and the high side switch Q2. The fuse F1 is also operable to open, if the low side switch Q1 shorts or fails. In this manner, the current source Isp will remain connected (or coupled) to the electrical bus 202.

The fuse F2 is coupled in series to the current source Isp and is operable to open, if the CR1 shorts or fails. If CR1 shorts, a high current will circulate in a path of the bypass rectifier CR1 and the high side switch Q2 until fuse F1 or F2 opens. In this manner, the current source Isp (102 in FIG. 1) will remain connected (or coupled) to the electrical bus 202. The fuse F2 is also operable to open, if the current source Isp shorts to ground. In this case the current source Isp no longer provides power to the electrical bus 202.

The high side switch Q2 is coupled to the fuse F1, a bypass rectifier CR1, the output capacitor C1, and the electrical bus 202. The high side switch Q2 is operable to either connect the current source Isp to the electrical bus 202 or connect the current source Isp to the common ground 204. Generally a high side switch (coupled to an electrical bus) is a rectifier. However, in the embodiment shown in FIG. 2, a FET such as the high side switch Q2 is used as the high side switch so that power dissipation is significantly reduced. Synchronous rectification reduces the power dissipation in power devices. Lower power dissipation reduces the weight of the power devices since less heat sink material is required and components may be packaged more densely. In this manner, weight of a vehicle, such as a spacecraft coupled to the system 200, can be reduced since less thermal management hardware is required.

The output capacitor C1 is coupled in series to the fuse F3 and the electrical bus 202 and is operable to receive charge from the current source Isp.

In an existing solution, if a low side switch connects the current source Isp permanently to a common ground, power is lost. However, in contrast to the existing solution, in the embodiments shown in FIG. 2, if the low side switch Q1 connects the current source Isp to the common ground 204, the high side switch Q2 turns on, the fuse F1 opens and removes the short to the common ground 204, leaving the current source Isp connected (or coupled) to the electrical bus 202.

The bypass rectifier CR1 is coupled to the high side switch Q2, the fuse F2, the current source Isp, and the electrical bus 202 and is operable to rectify current from the current source Isp.

As mentioned above, the current source Isp may comprise, a power source, such as but without limitation, a battery, satellite and spacecraft aircraft power sources, shipboard generators, train power sources, solar and engine powered long-duration aircraft and spacecraft (manned and unmanned) power sources, a super-heated thermal couple from a reactor, and the like.

The electrical bus 202 is operable to distribute electrical current, and may be, for example but without limitation, a spacecraft power bus, a satellite power bus, a ship electrical bus, an automobile electrical bus, a power grid electrical bus, and the like. The electrical bus 202 may be coupled to a load 208 (108 in FIG. 1), such as but without limitation, an electronic device, a motor, a heater, a power distribution system, an appliance, an additional electrical bus, and the like.

The system 200 is operable to function as a synchronous power switch with the fuse F1 coupled to the low side switch Q1 and fuses F1 and F2 in switch paths. In this manner, the system 200 automatically clears faults when any power stage device such as the high side switch Q2, the low side switch Q1, the output capacitor C1, the bypass rectifier CR1, and the current source Isp fails in a shorted/fault mode.

In one embodiment, the output capacitor fuse F3 may comprise, for example but without limitation, a series redundant capacitor.

The system 200 results in a substantially highest optimal efficiency since the switched paths comprise only one FET (i.e., the high side switch Q2 or the low side switch Q1), which has a lower voltage drop than a diode would generally have.

Figure 3:
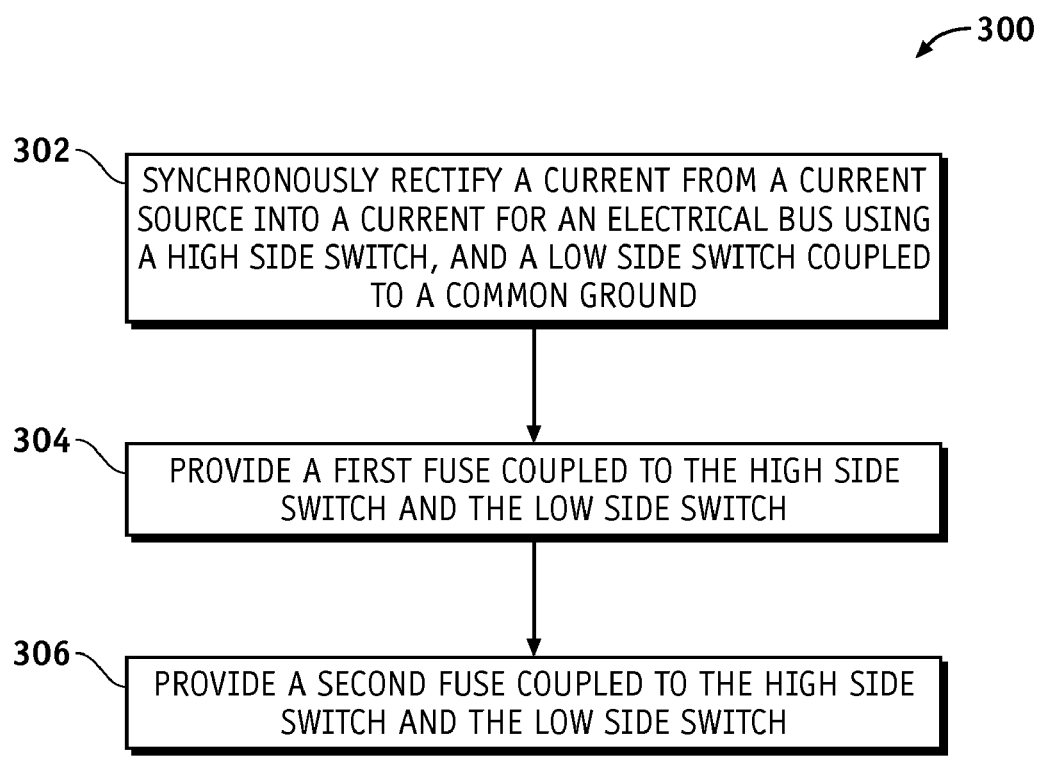
FIG. 3 is an illustration of an exemplary flowchart showing an automatic fault tolerant synchronous rectified regulation process according to an embodiment of the disclosure.

FIG. 3 is an illustration of an exemplary flowchart showing an automatic fault tolerant synchronous rectified regulation process 300 (process 300) according to an embodiment of the disclosure. The various tasks performed in connection with the process 300 may be performed mechanically, by software, hardware, firmware, or any combination thereof. It should be appreciated that the process 300 may include any number of additional or alternative tasks, the tasks shown in FIG. 3 need not be performed in the illustrated order, and the process 300 may be incorporated into a more comprehensive procedure or process having additional functionality not described in detail herein.

For illustrative purposes, the following description of the process 300 may refer to elements mentioned above in connection with FIGS. 1-2. In practical embodiments, portions of the process 300 may be performed by different elements of the system 200 such as: the high side switch Q2, the low side switch Q1, the output capacitor C1, the fuse F1, the fuse F2, the fuse F3, the bypass rectifier CR1, the current source Isp, and the electrical bus 202, etc. The process 300 may have functions, material, and structures that are similar to the embodiments shown in FIGS. 1-2. Therefore common features, functions, and elements may not be redundantly described here.

Process 300 may begin by synchronously rectifying a current from the current source Isp into a current for the electrical bus 202 using the high side switch Q2, and the low side switch Q1 coupled to the common ground 204 (task 302).

Process 300 may continue by providing the first fuse F1 coupled to the high side switch Q2 and the low side switch Q1 (task 304).

Process 300 may continue by providing the second fuse F2 coupled to the high side switch Q2 and the first fuse F1 (task 306).

Figure 4:
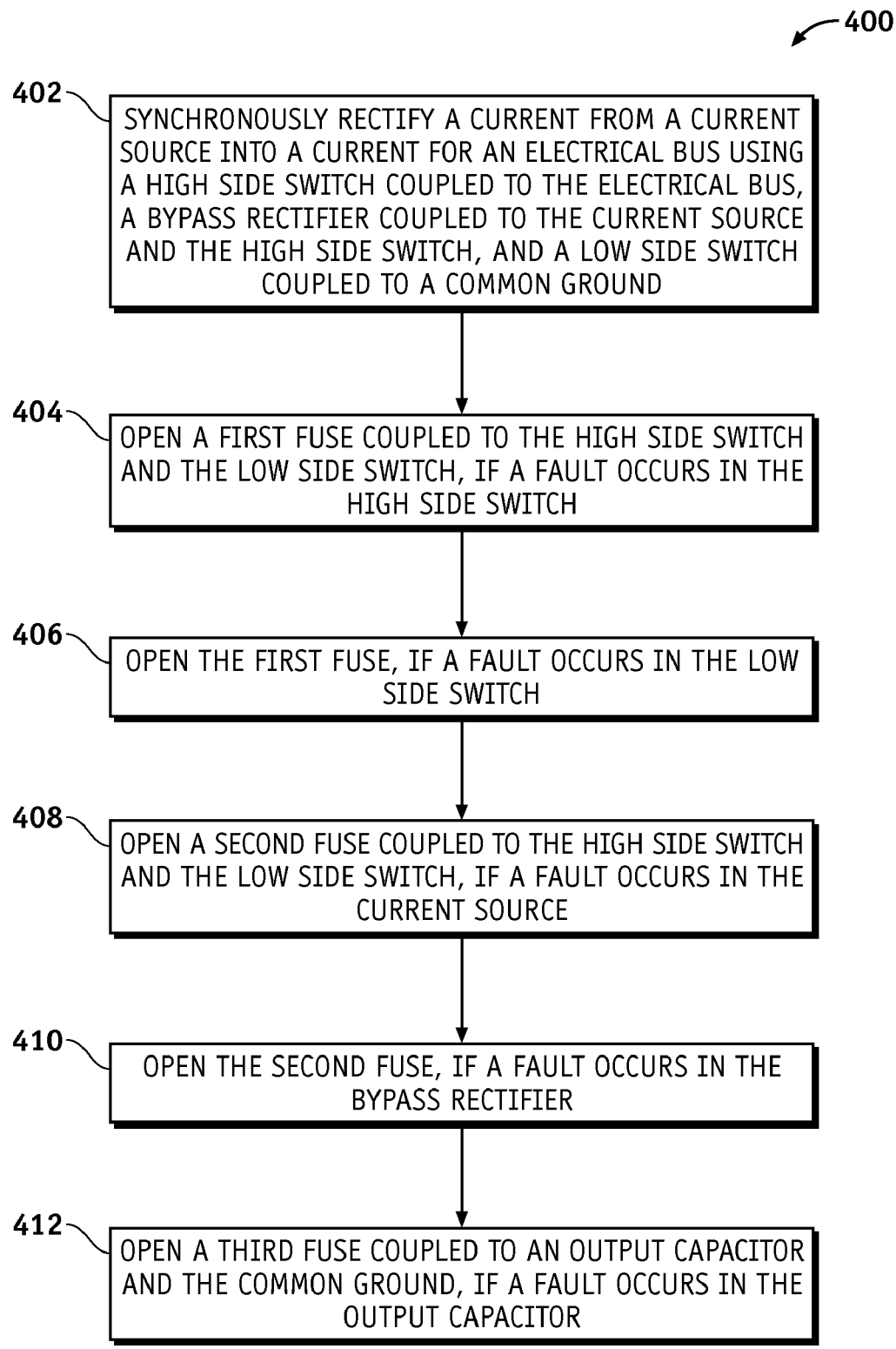
FIG. 4 is an illustration of an exemplary flowchart showing a process for fault tolerant synchronous rectification of a regulator system according to an embodiment of the disclosure.

FIG. 4 is an illustration of an exemplary flowchart showing a process 400 for fault tolerant synchronous rectification of the regulator system 200 according to an embodiment of the disclosure. The various tasks performed in connection with the process 400 may be performed mechanically, by software, hardware, firmware, or any combination thereof. It should be appreciated that the process 400 may include any number of additional or alternative tasks, the tasks shown in FIG. 4 need not be performed in the illustrated order, and the process 400 may be incorporated into a more comprehensive procedure or process having additional functionality not described in detail herein.

For illustrative purposes, the following description of process 400 may refer to elements mentioned above in connection with FIGS. 1-2. In practical embodiments, portions of the process 400 may be performed by different elements of the system 200 such as: the high side switch Q2, the low side switch Q1, the output capacitor C1, the fuse F1, the fuse F2, the fuse F3, the bypass rectifier CR1, the current source Isp, the electrical bus 202, etc. The process 400 may have functions, material, and structures that are similar to the embodiments shown in FIGS. 1-2. Therefore common features, functions, and elements may not be redundantly described here.

Process 400 may begin by synchronously rectifying a current from the current source Isp into a current for the electrical bus 202 using the high side switch Q2 coupled to the electrical bus 202, the bypass rectifier CR1 coupled to the current source Isp and the high side switch Q2, and the low side switch Q1 coupled to the common ground 204 (task 402).

Process 400 may continue by opening the first fuse F1 coupled to the high side switch Q2 and the low side switch Q1, if a fault occurs in the high side switch Q2 (task 404).

Process 400 may continue by opening the first fuse F1, if a fault occurs in the low side switch Q1 (task 406).

Process 400 may continue by opening a second fuse F2 coupled to the high side FET switch Q2 and the first fuse F1, if a fault occurs in the current source Isp (task 408).

Process 400 may continue by opening the second fuse F2, if a fault occurs in the bypass rectifier CR1 (task 410).

Process 400 may continue by opening the third fuse F3, if a fault occurs in the output capacitor C1 (task 420).

In this way, embodiments of the disclosure automatically clear faults when any power stage device fails in a shorted mode. A fault tolerant synchronous rectifier regulator system is used to reduce power dissipation. Lower power dissipation reduces the weight of the power stage devices since less heat sink material is required and components may be packaged more densely. In this manner, spacecraft weight can be reduced since less thermal management hardware is required. Reducing the weight also translates into space and cost savings, which are useful for many types of power sources and load interaction devices.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-2 depict example arrangements of elements, additional intervening elements, devices, features, or components may be present in an embodiment of the disclosure.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A fault tolerant synchronous rectifier regulator system comprising:
   a high side switch operable to be coupled to an electrical bus;
   a low side switch coupled to a common ground;
   a first fuse coupled to the high side switch and the low side switch, and operable to open in response to a first fault;
   a second fuse coupled to the high side switch and the first fuse, and operable to be coupled to a current source and to open in response to a second fault; and
   a bypass rectifier to be coupled to the current source, and coupled to the second fuse and the high side switch, wherein the second fuse opens in response to the second fault in the bypass rectifier.

2. The system according to claim 1, wherein the first fuse opens in response to the first fault in the high side switch.

3. The system according to claim 1, wherein the first fuse opens in response to the first fault in the low side switch.

4. The system according to claim 1, wherein the second fuse opens in response to the second fault in the current source.

5. The system according to claim 1, wherein the current source comprises at least one solar panel.

6. The system according to claim 1, further comprising the electrical bus to be coupled to the low side switch, wherein the electrical bus comprises one of a spacecraft power bus, a satellite power bus, a ship electrical bus, an automobile electrical bus, and a power grid electrical bus.

7. The system according to claim 1, further comprising:
   a third fuse coupled in series to an output capacitor and the common ground, and operable to open in response to a third fault in the output capacitor.

8. The system according to claim 7, wherein the third fuse comprises a series redundant capacitor.

9. The system according to claim 1, wherein the high side switch reduces power dissipation.

10. The system according to claim 1, wherein the current source remains coupled to the electrical bus in response to at least one of: the first fault and the second fault.

11. An automatic fault tolerant synchronous rectified regulation method, the method comprising:
    synchronously rectifying a current from a current source into a current for an electrical bus using a high side switch and a low side switch coupled to a common ground;
    providing a first fuse coupled to the high side switch and the low side switch; and
    providing a second fuse coupled to the high side switch and the first fuse; and
    providing a bypass rectifier operable to be coupled to the current source, and coupled to the second fuse and the high side switch; and
    opening the second fuse in response to a fault in the bypass rectifier.

12. The method according to claim 11, further comprising:
    opening the first fuse in response to a fault in the high side switch; and
    opening the first fuse in response to a fault in the low side switch.

13. The method according to claim 11, further comprising opening the second fuse in response to a fault in the current source.

14. The method according to claim 11, further comprising:
providing an output capacitor operable to be coupled to the electrical bus;
providing a third fuse coupled in series to the output capacitor and the common ground; and
opening the third fuse in response to a fault in the output capacitor.

15. The method according to claim 11, wherein the current source remains coupled to the electrical bus in response to the fault in the bypass rectifier.

16. A method for fault tolerant synchronous rectification of a regulator system, the method comprising:
synchronously rectifying a current from a current source into a current for an electrical bus using a high side switch coupled to the electrical bus, a bypass rectifier coupled to the current source and the high side switch, and a low side switch coupled to a common ground;
opening a first fuse coupled to the high side switch and the low side switch, if a fault occurs in the high side switch;
opening the first fuse, if a fault occurs in the low side switch;
opening a second fuse coupled to the high side switch and the low side switch, if a fault occurs in the current source; and
opening the second fuse, if a fault occurs in the bypass rectifier.

17. The method according to claim 16, further comprising opening a third fuse coupled to an output capacitor and the common ground, if a fault occurs in the output capacitor.

18. The method according to claim 16, wherein the current source comprises at least one solar panel.

19. The method according to claim 16, wherein the electrical bus comprises one of a spacecraft power bus, a satellite power bus, a ship electrical bus, an automobile electrical bus, and a power grid electrical bus.

20. The method according to claim 16, further comprising reducing power dissipation by using the high side switch, wherein the high side switch comprises a FET.

21. A fault tolerant synchronous rectifier regulator system comprising:
a high side switch operable to be coupled to an electrical bus;
a low side switch coupled to a common ground;
a first fuse coupled to the high side switch and the low side switch, and operable to open in response to a first fault;
a second fuse coupled to the high side switch and the first fuse, and operable to be coupled to a current source and to open in response to a second fault; and
a third fuse coupled in series to an output capacitor and the common ground, and operable to open in response to a third fault in the output capacitor.

22. An automatic fault tolerant synchronous rectified regulation method, the method comprising:
synchronously rectifying a current from a current source into a current for an electrical bus using a high side switch and a low side switch coupled to a common ground;
providing a first fuse coupled to the high side switch and the low side switch;
providing a second fuse coupled to the high side switch and the first fuse;
providing an output capacitor operable to be coupled to the electrical bus;
providing a third fuse coupled in series to the output capacitor and the common ground; and
opening the third fuse in response to a fault in the output capacitor.

* * * * *